United States Patent [19]
Koyama

[11] Patent Number: 5,486,713
[45] Date of Patent: Jan. 23, 1996

[54] SEMICONDUCTOR DEVICE HAVING A CAPACITOR

[75] Inventor: Kuniaki Koyama, Tokyo, Japan

[73] Assignee: NEC Corporation, Tokyo, Japan

[21] Appl. No.: 450,921

[22] Filed: May 26, 1995

Related U.S. Application Data

[63] Continuation of Ser. No. 177,865, Jan. 4, 1994, abandoned.

[30]  Foreign Application Priority Data

Jan. 5, 1993 [JP] Japan ..................... 5-000158

[51] Int. Cl.⁶ .................. H01L 27/08; H01L 29/76; H01L 29/94; H01L 31/119
[52] U.S. Cl. .............. 257/310; 257/296; 257/297; 257/298
[58] Field of Search ...................... 257/310, 296, 257/297, 298

[56]  References Cited

U.S. PATENT DOCUMENTS

| | | | |
|---|---|---|---|
| 4,423,087 | 12/1983 | Howard et al. | 257/310 |
| 4,982,309 | 1/1991 | Shepherd | 361/321 |
| 5,189,503 | 2/1993 | Suguro et al. | 257/310 |

FOREIGN PATENT DOCUMENTS

| | | | |
|---|---|---|---|
| 60-037766 | 2/1985 | Japan | 257/310 |
| 2226754 | 9/1990 | Japan | 257/310 |
| 3256358 | 11/1991 | Japan | 257/310 |
| 4099057 | 3/1992 | Japan | 257/310 |
| 4092468 | 3/1992 | Japan | 257/310 |
| 4177760 | 6/1992 | Japan | 257/310 |

OTHER PUBLICATIONS

Ohta et al, *IEEE Trans on Ed*, . . . High Cap Ram Using Ta O . . . ', vol. ED–29 No. 3, 3 Mar. 1982, pp. 368–376.

*Primary Examiner*—Stephen D. Meier
*Attorney, Agent, or Firm*—Sughrue, Mion, Zinn, Macpeak & Seas

[57]  ABSTRACT

A semiconductor device having a capacitor includes a substrate, an insulating film formed on a surface of the substrate, a lower electrode formed on said insulating film, the lower electrode including a metal film the oxide of which is conductive, a dielectric film formed on said lower electrode, a sidewall spacer formed on sidewalls of said lower electrode and said dielectric film, the sidewall spacer being made of a dielectric material having a dielectric constant lower than the dielectric constant of said dielectric film, and an upper electrode formed on said dielectric film and the sidewall spacer.

9 Claims, 12 Drawing Sheets

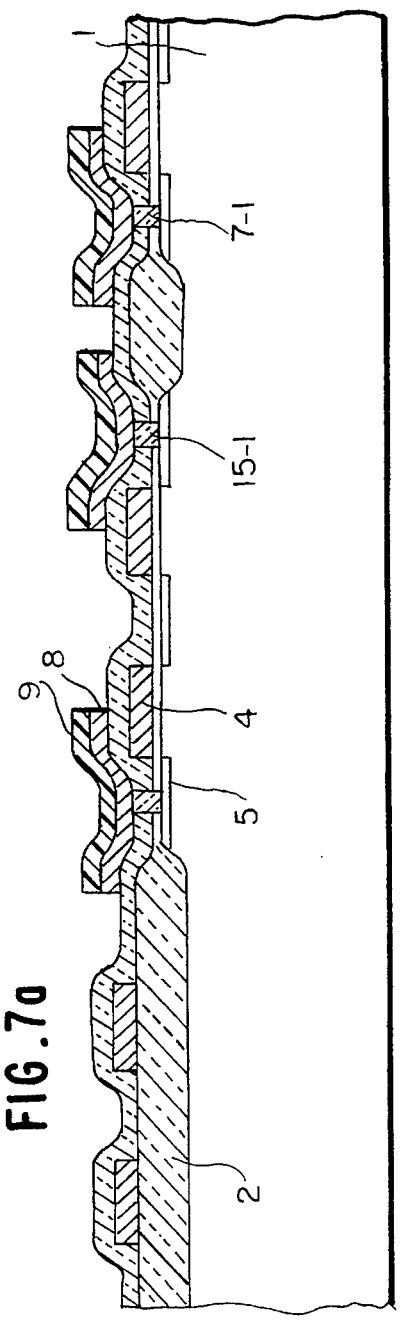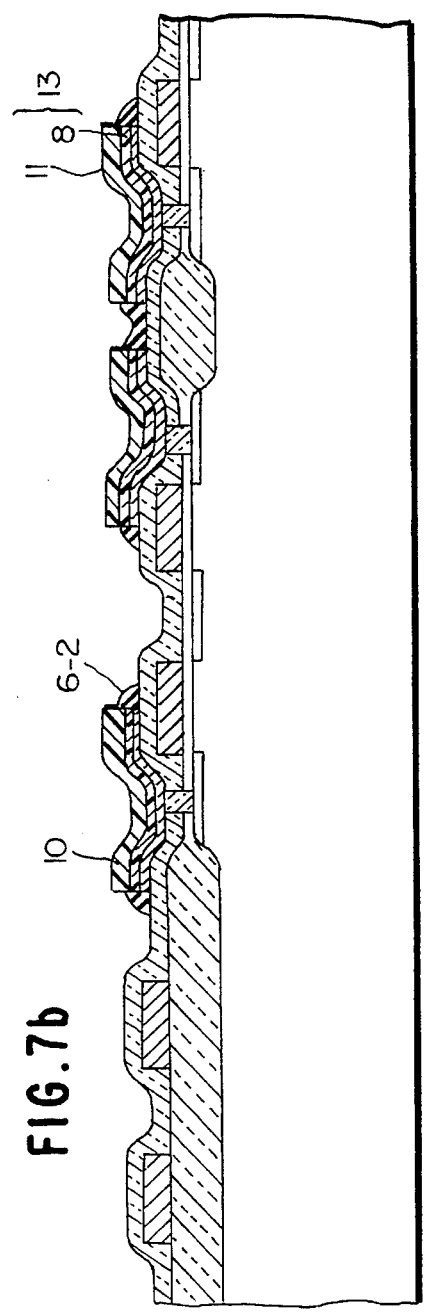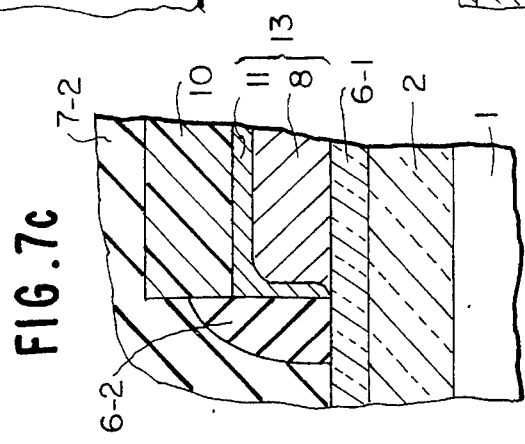
FIG.7a
FIG.7b
FIG.7c

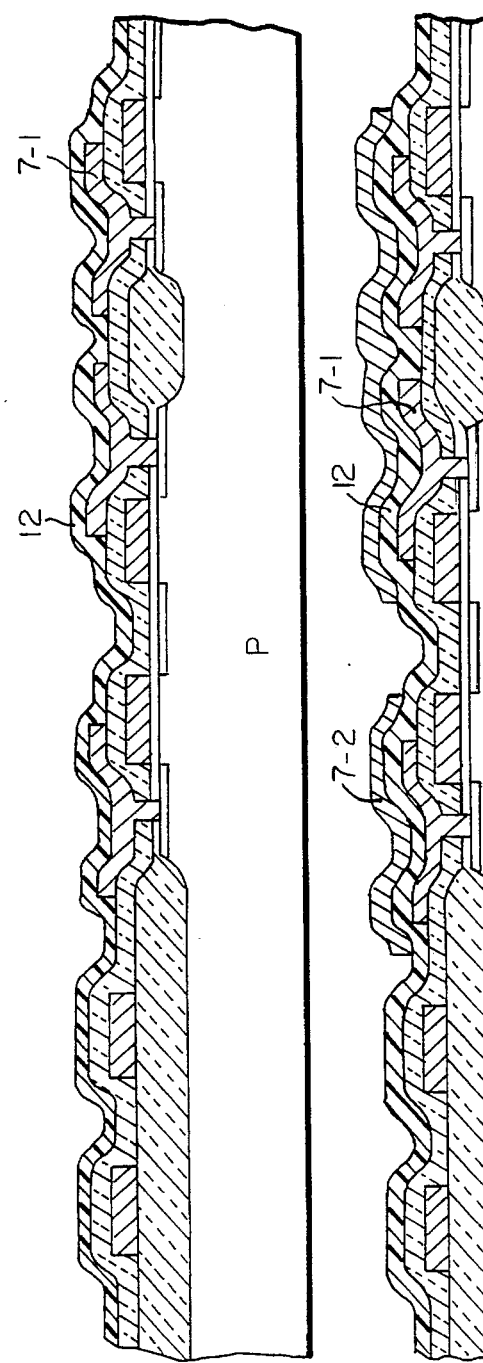
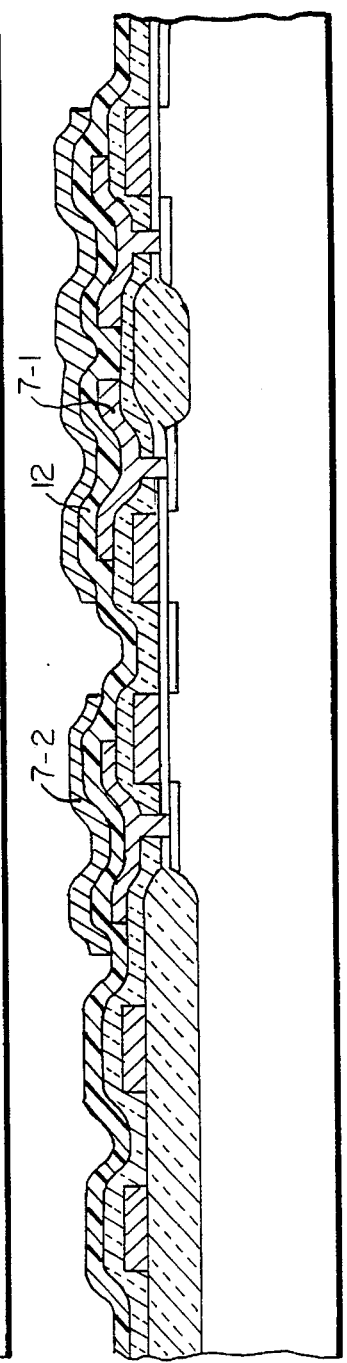
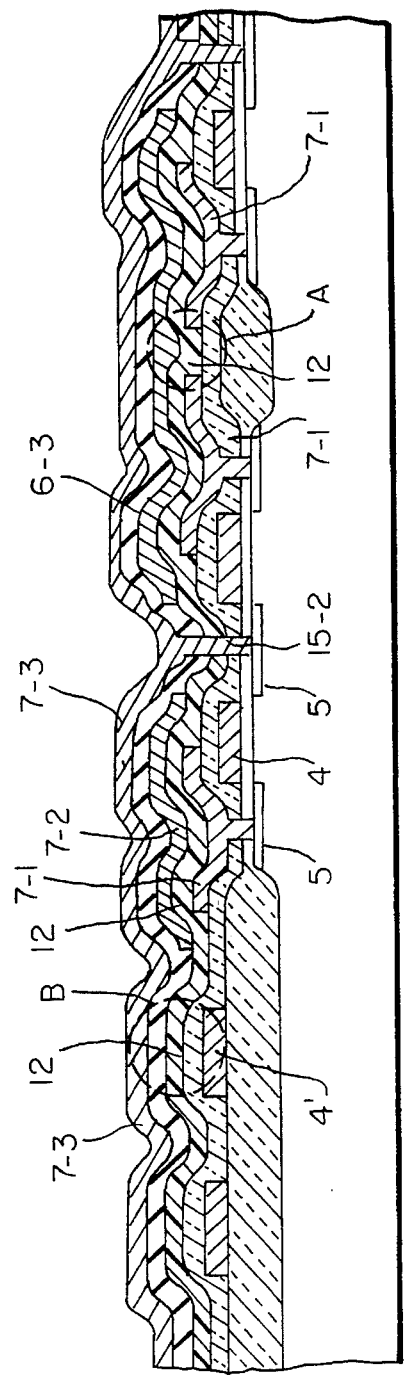
FIG.10d PRIOR ART
FIG.10e PRIOR ART
FIG.10f PRIOR ART 5,486,713

SEMICONDUCTOR DEVICE HAVING A CAPACITOR

This is a Continuation of Application No. 08/177,865 filed Jan. 4, 1994, now abandoned.

BACKGROUND OF THE INVENTION

1. Field of the Invention

The present invention relates to a semiconductor device, and more particularly to a device which includes a capacitor.

2. Description of the Related Art

Dynamic random access memories (DRAMs) with memory cells consisting of a single transistor and a capacitor are known. As is also known in relation to DRAMs, data is stored as charge accumulation in the cell capacitor. With attempts to increase the integration level and thus the packing density of such memories comes the problem of maintaining sufficient charge accumulation in the cell capacitor. One attempted solution involves providing the cell capacitor with a dielectric film having a high dielectric constant.

An example of a conventional semiconductor memory device with a capacitor, and of a process by which it can be formed is illustrated in FIGS. 10a to 10f.

As illustrated in FIG. 10a, there is provided a p-type silicon substrate on which are formed a field oxide film 2 and gate oxide film 3. The field oxide and gate oxide may be formed using conventional selective oxidation techniques. Gate electrodes 4 are provided for connection to word lines (not shown). N-type diffusion layers 5 are formed as source and drain regions of the memory cell transistor.

As illustrated in FIG. 10b, an interlayer insulating film 6-1 is formed and then selectively etched to open a first contact hole 15-1. Referring to FIG. 10c, a first conductor layer 7-1, which may be a polysilicon layer, is formed over the upper layer of the device being formed. The first conductor layer 7-1 is selectively etched (FIG. 10d) to form a lower electrode. A dielectric film 12 having a high dielectric constant is then formed. The high-dielectric-constant film 12 is formed, for example, by sputtering $SrTiO_3$ or the like, or by the anodicoxidation of tantalum.

As illustrated in FIG. 10e, a second conductor layer 7-2 is formed and selectively etched to form an upper electrode. Thus lower and upper electrodes 7-1, 7-2, respectively, and dielectric film 12 constitute a capacitor element. Interlayer insulating film 6-3 is formed and selectively etched to open a second contact hole 15-2 (FIG. 10f). A conductor layer 7-3 is then formed as a bit line connected to the source or drain region of the cell transistor. Thus, a memory cell is fabricated.

A disadvantage of the above described prior art memory cell is that the sputtering of $SrTiO_3$ or the like or the anodicoxidation of tantalum causes the surface of the first conductor layer 7-1, when made of polysilicon, to oxidize to a silicon oxide film of a low dielectric constant, resulting in a cell capacitor having a small storage capacitance. In addition, the formation of the high-dielectric-constant film 12 over the entire surface, as described above, causes an increase in parasitic capacitance, due to the existence of the film 12 (represented by a circle A in FIG. 10f) between lower electrodes of adjacent memory cell capacitors, and similarly an increase in parasitic capacitance due to the existence of the film 12 (represented by a circle B in FIG. 10f) between word line 4' connected to a gate electrode of an adjacent memory cell transistor and a bit line consisting of a third conductor layer 7-3.

U.S. Pat No. 4,982,309 discloses an electrical ceramic oxide device. A ruthenium oxide film is used as a lower electrode of the device. An electrical ceramic oxide dielectric material is deposited over the body of the lower electrode. Such a device exhibits a parasitic capacitance problem similar to that described above.

BRIEF SUMMARY OF THE INVENTION

Accordingly, it is an object of the present invention to provide a semiconductor device which overcomes the above mentioned problems of conventional semiconductor devices with a capacitor.

A feature of the present invention resides in a semiconductor device which includes an insulating film formed on a surface of a semiconductor substrate; a lower capacitor electrode formed on said insulating film, which lower electrode may include a conductive metal oxide film; a dielectric film formed on said lower electrode; a sidewall spacer formed on sidewalls of said lower electrode and said dielectric film, the sidewall spacer being made of a dielectric material having a dielectric constant lower than the dielectric constant of said dielectric film; and an upper capacitor electrode formed on said dielectric film and said sidewall spacer.

BRIEF DESCRIPTION OF THE DRAWINGS

The above and further objects, features and advantages of the present invention will become more apparent from the following detailed description of embodiments of the invention taken in conjunction with the accompanying drawings, wherein:

FIGS. 7a to 7c are sectional views illustrating another example of a process for fabricating the third embodiment of the invention;

FIGS. 10a to 10f are sectional views illustrating in sequence an example of a process for fabricating a conventional semiconductor device.

DETAILED DESCRIPTION OF THE PREFERRED EMBODIMENTS

Figure 1:
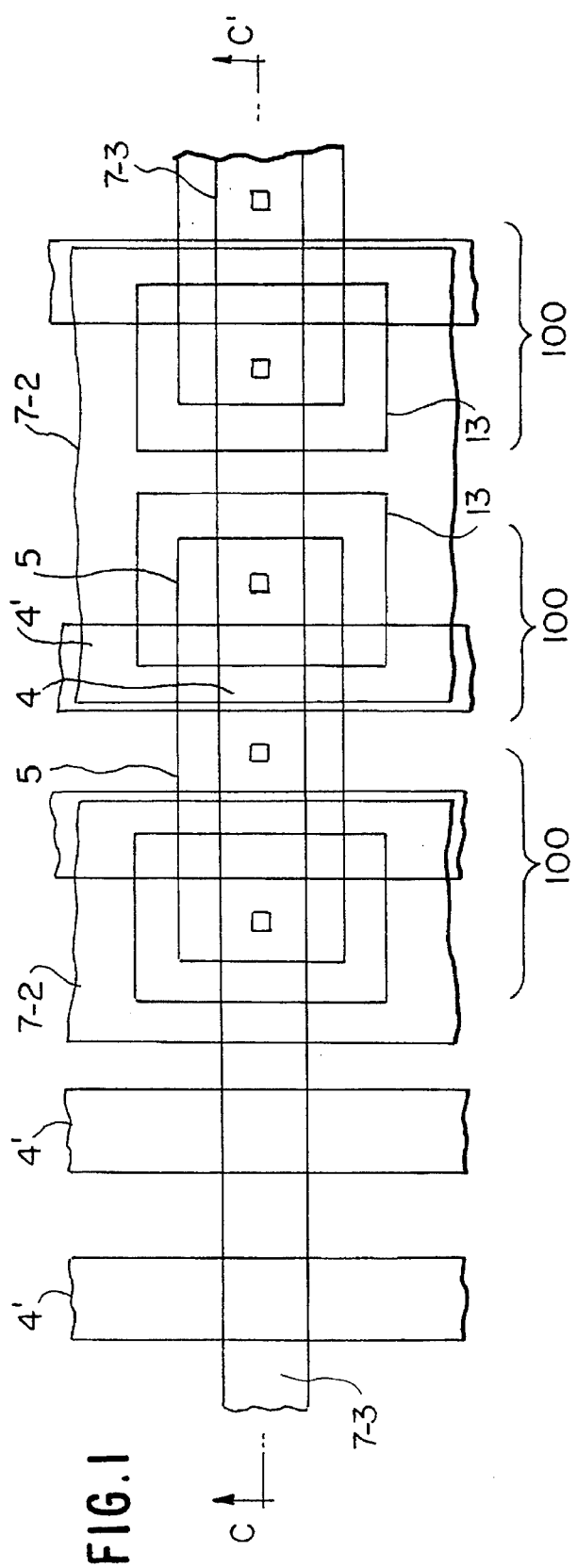
FIG. 1 is a schematic plan view showing the layout of a first embodiment of the present invention.

FIG. 1 is a schematic plan view showing the layout of memory cells 100, consisting of diffused layers, electrodes and wirings. The preferred embodiments of these memory cells will be described herein after with reference to the FIGS. 2–9 which are sectional views of the memory cells taken along line C—C'.

Figure 2:
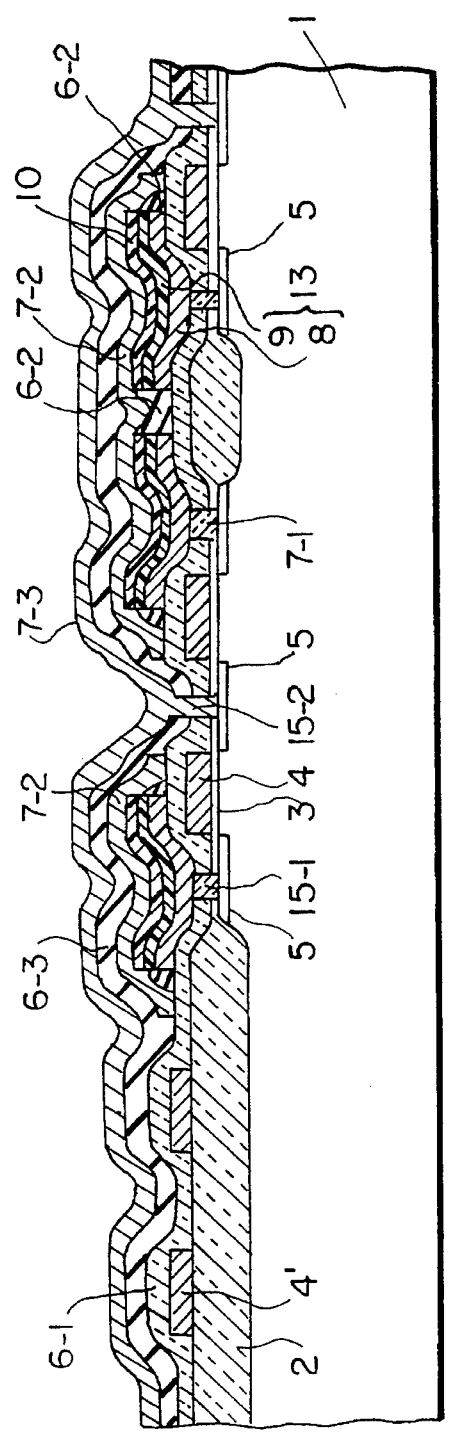
FIG. 2 is a sectional view of the first embodiment of the present invention.

Referring to FIG. 2, field insulating film 2 is selectively formed on the major surface of a p-type silicon substrate 1 to isolate an active area on which gate insulating film 3 is formed. A gate electrode 4 is formed on the insulating film 3. Additionally, an n-type diffused layer is formed as source and drain region 5 of the transistor of a memory cell. The memory cell includes stacked capacitor elements consisting of a lower electrode 13, an upper electrode 7-2 and a dielectric film of tantalum oxide film 10 between them. Lower electrode 13 is connected to source or drain region 5 through the first conductor layer 7-1 filling a contact hole 15-1 opened in the first interlayer insulating film 6-1.

In this first embodiment, lower electrode 13 is constructed of high-melting-point metal film or a refractory metal film 8 and the overlying tantalum film 9. Dielectric film 10 is formed to be in contact with the surface of tantalum film 9. Lower electrode 13 and dielectric film 10 are patterned such that dielectric film 10 is formed in the same plane as the lower electrode 13. On the sidewalls of lower electrode 13 and film 10 are formed insulating films 6-2 (referred to as sidewall spacers). Upper electrode 7-2 is formed on, and extends between, dielectric film 10 and the sidewall spacer 6-2. A second interlayer insulating film 6-3 is formed as the overlying layer. A third conductor layer 7-3 forming a bit line is connected to the other of the source or drain region 5 through the second contact hole 15-2 which extends through the first and third interlayer insulating films. On field insulating film 2 and beneath the first interlayer insulating film 6-1 runs a gate electrode 4 which serves as a word line 4'.

The process of fabricating the first embodiment will be set forth in a fabrication-process sequence with reference to FIGS. 3a to 3h.

Figure 3E:
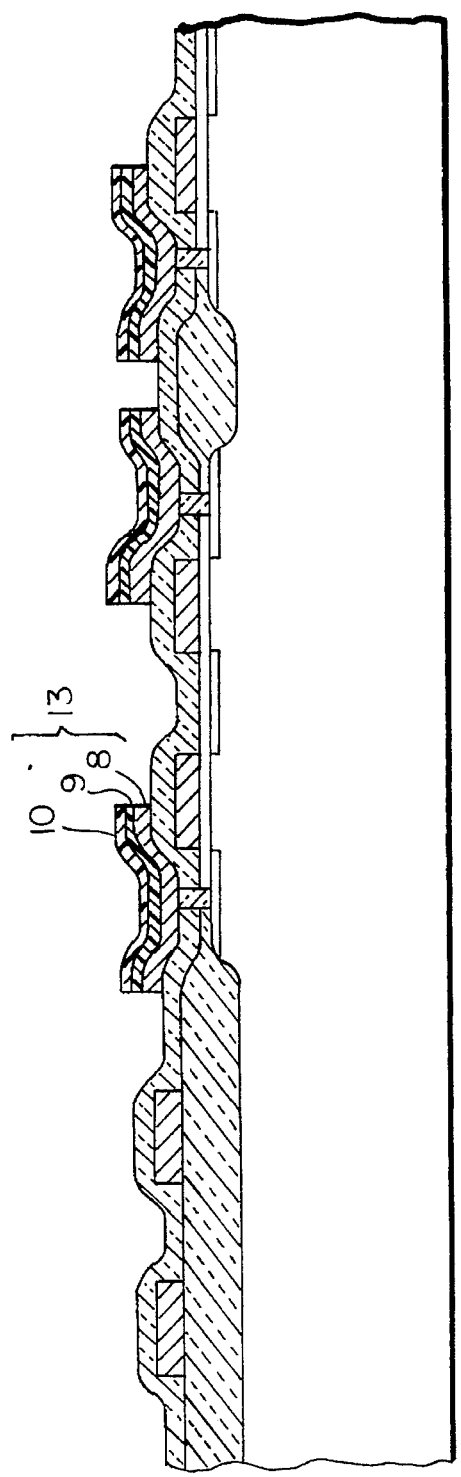
FIGS. 3a to 3h are sectional views illustrating in sequence an example of a process for fabricating the first embodiment of the present invention.
Figure 3F:
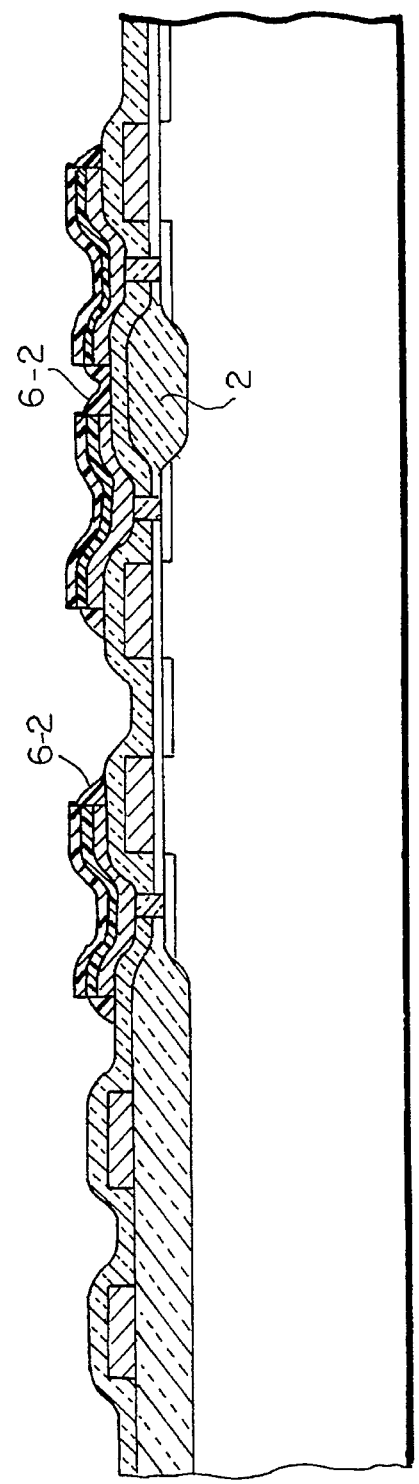
Figure 3A:
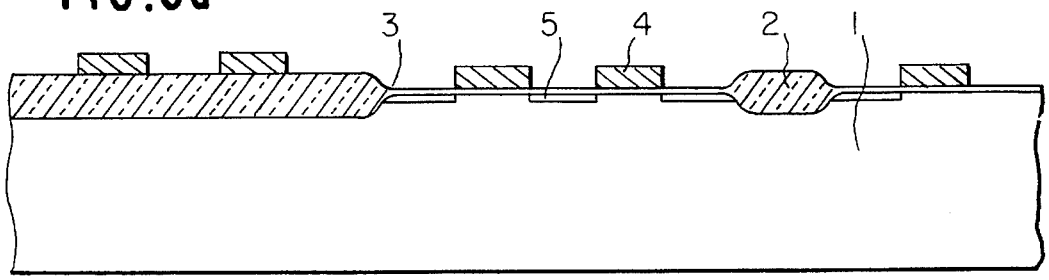

As illustrated in FIG. 3a, field oxide film 2 and gate oxide 3 are formed by selective oxidation on a p-type silicon substrate 1. A gate electrode 4 is formed, for example, by patterning polysilicon. Using the gate electrode as a mask, n-type diffusion layer 5 is formed by ion implantation of an impurity into the substrate to produce source and drain regions of the transistor.

Figure 3B:
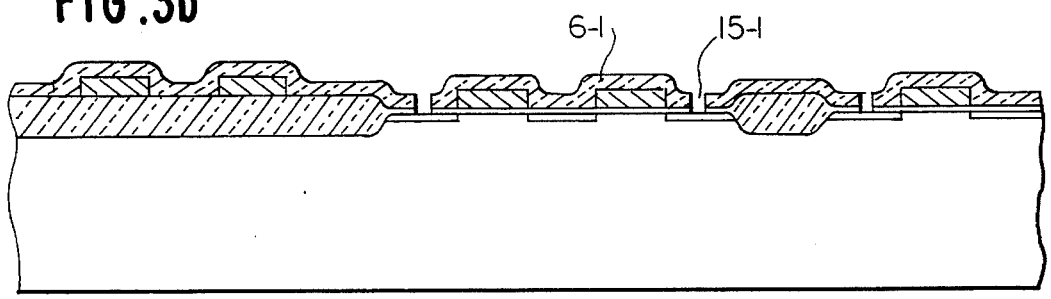
Figure 3C:
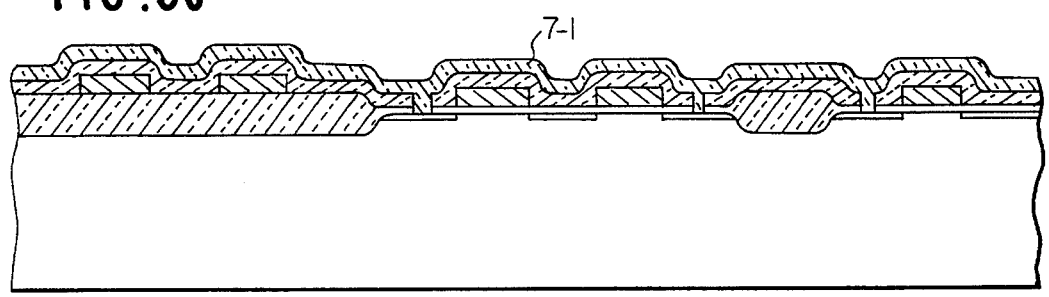
Figure 3D:
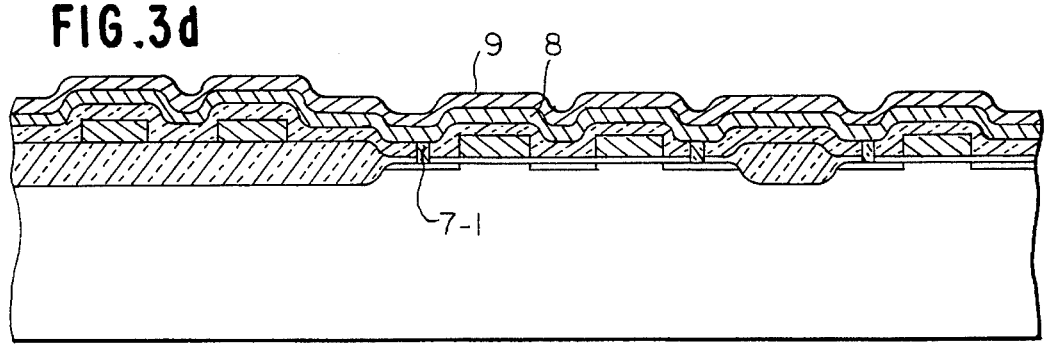

As illustrated in FIG. 3b, a first interlayer insulating film 6-1, such as CVD silicon oxide film, is overlaid and selectively etched to open the first contact hole 15-1 above the source or drain region 5. As illustrated in FIG. 3c, the first conductor layer 7-1, which may be a polysilicon film, is then provided, and etched back to form the first contact hole 15-1 (FIG. 3d). Thereafter high-melting-point (refractory) metal film 8 of, for example, ruthenium is formed to a thickness of 100 nm and thereover tantalum film 9 is formed to a thickness of 100 nm. The oxide of the high-melting-point metal film 8 preferably has a resistivity of less than $10^{-3}$ $\Omega \cdot cm$, and is preferably selected from the group consisting of Ru (ruthenium), Mo (molybdenum), Tc (technetium), Rh (rhodium), W (tungsten), Re (rhenium), Os (osmium), Ir (iridium) and Pt (platinum).

As illustrated in FIG. 3e, the surface of the tantalum film 9 is oxidized to form a tantalum oxide film 10 to a thickness of 50 nm in an $O_2$ (oxygen) atmosphere at a specified temperature between 450° C. and 600° C. for a definite time from 5 to 15 min. These films are patterned to lie in the same plane. Thus the lower electrode 13 of the DRAM capacitor element is constructed of the high-melting-point metal film 8, which may be ruthenium, and the tantalum film 9, and the dielectric film, located in the plane containing the lower electrode 13, consists of a tantalum oxide film 10.

As illustrate in FIG. 3f, a CVD silicon oxide film is grown to a thickness of 100 nm over the entire surface, and etched back to leave sidewall spacers 6-2 on the combined sides of tantalum oxide film 10, tantalum film 9 and ruthenium film 8. These sidewall spacers completely fill the area above field oxide film 2 between adjacent capacitor lower electrodes.

Figure 3G:
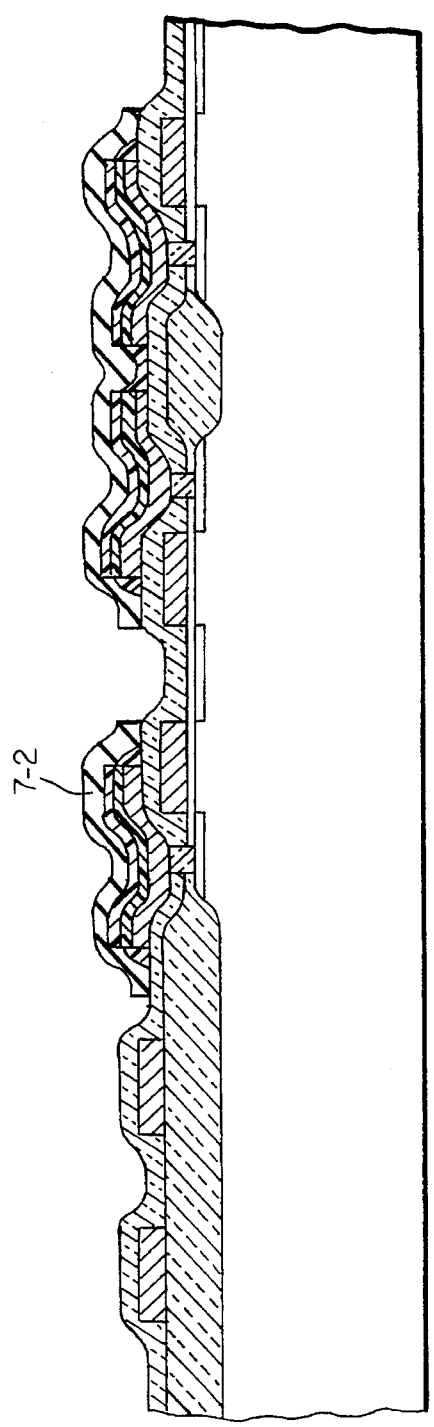
Figure 3H:
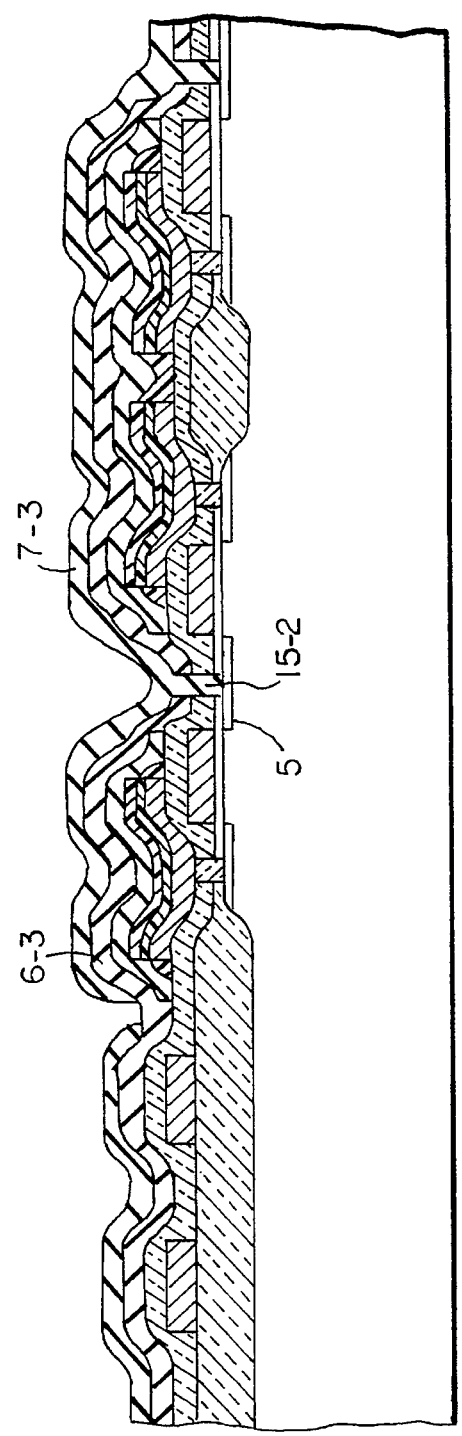

As illustrated in FIG. 3g, the second conductor layer 7-2 may, for example, comprise a titanium nitride film which is etched to leave only the portions to be the upper electrode. As illustrated in FIG. 3h, as the third interlayer insulating film 6-3, for example, a layer of CVD silicon oxide film is overlaid and selectively etched to form a plurality of the second contact holes 15-2. Thereafter, for example, a layer of tungsten silicide is overlaid as the third conductor layer 7-3, and patterned to form bit line 7-3 connected to the other source or drain region 5. Thus, a DRAM memory cell illustrated in FIG. 2 is constructed.

Figure 4A:
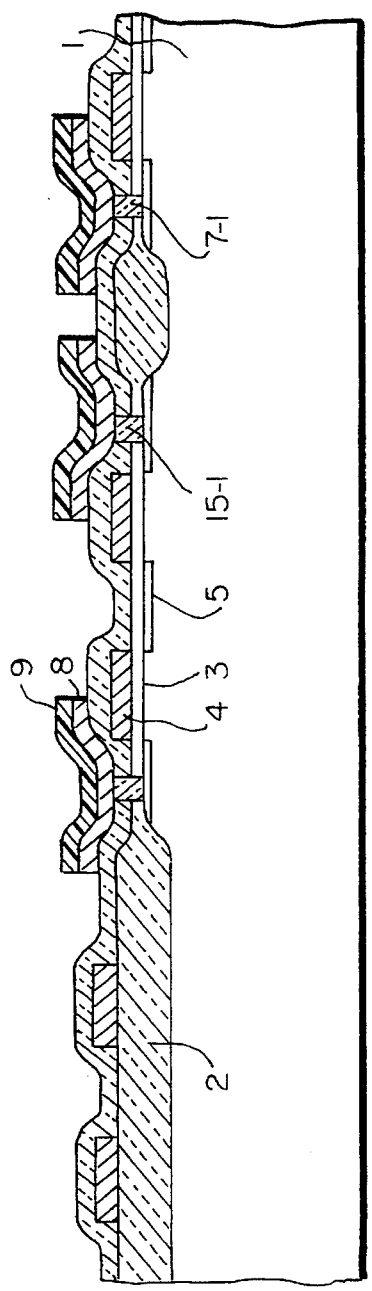
FIGS. 4a to 4c are sectional views illustrating another example of a process for fabricating the first embodiment of the present invention.
Figure 4B:
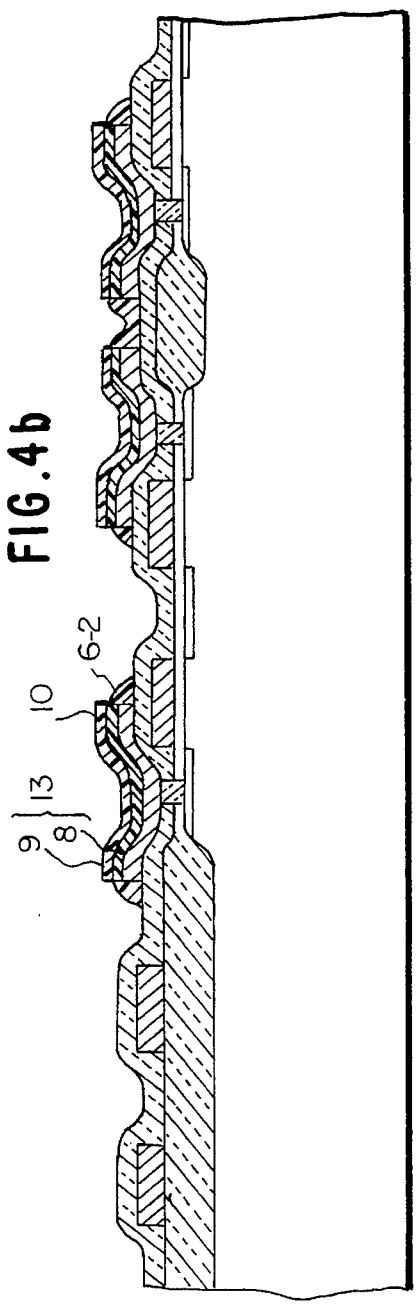
Figure 4C:
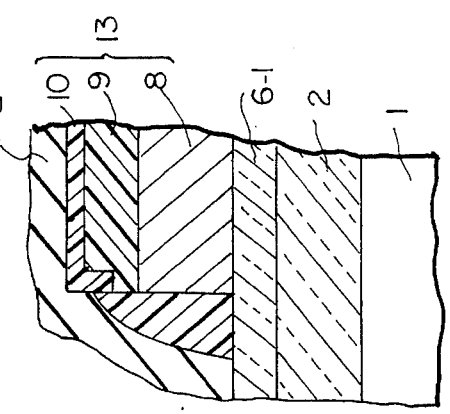

FIGS. 4a to 4c illustrate another example of a process for fabricating the first embodiment of the invention illustrated in FIG. 2. Rather than the process illustrated in FIG. 3e, which shows the state of the device after the tantalum oxide film 10 has been formed by oxidation and then patterned, and FIG. 3f which shows the state of the device after the sidewall spacers 6-2 have been formed on the sides of these. On the other hand, the double layer consisting of ruthenium film 8 and tantalum film 9 is patterned as illustrated in FIG. 4a, and on the sidewalls of this double layer, sidewall spacers 6-2 are formed as shown in FIG. 4b. Thereafter tantalum oxide film 10 to be the capacitor-dielectric film is formed by oxidation. FIG. 4c illustrates to an enlarged scale after upper electrode 7-2 has been formed.

In the processing steps of FIGS. 3e and 3f, uniform thickness of tantalum oxide film 10 is formed over the whole surface of the tantalum film, therefore capacitance characteristic is uniform from the middle to the edge of the electrode. It however is needed for obtaining dielectric-breakdown strength at the edge portion of the upper electrode 7-2 and lower electrode 13 (8, 9) to cover the almost overall sides of tantalum oxide film 10 with sidewall spacers 6-2 under the exact control of the height of the sidewall spacers 6-2.

On the other hand, in the processing steps of FIGS. 4a and 4b, the tantalum oxide film 10 is formed also on the upper portion of the sides of tantalum film 9 as shown in FIG. 4c, and hence the capacitance characteristic is somewhat different between the middle and edge portions. It however is advantageous in the respect that even if the upper portions of the sides of tantalum film 9 are exposed after the formation of sidewall spacers 6-2, then tantalum oxide film 10 is thereafter formed by the later oxidation. Thus a specified value of dielectric-breakdown strength between upper electrode 7-2 and lower electrode 13 (8, 9) is obtained.

Figure 5:
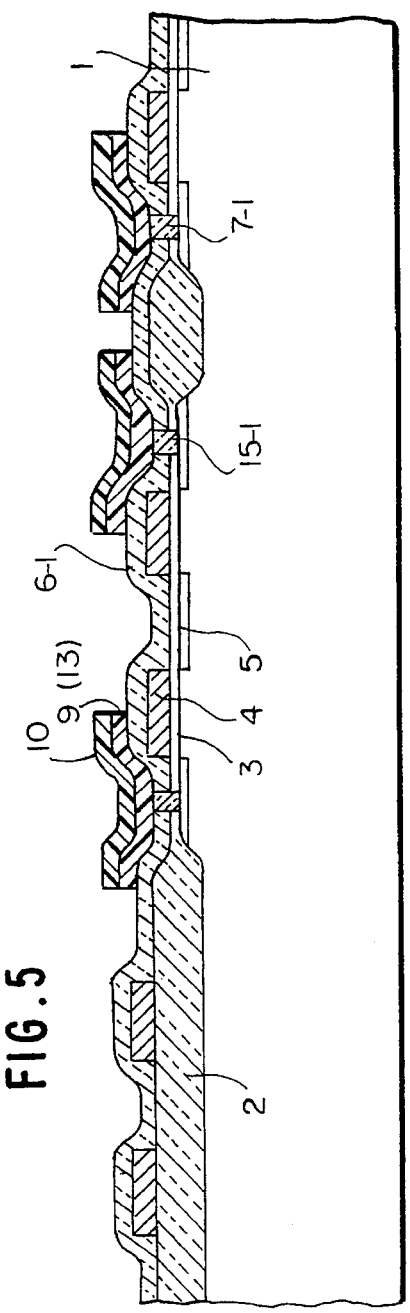
FIG. 5 is a sectional view illustrating a processing step for fabricating a second embodiment of the invention.

FIG. 5 is a cross sectional view of a processing step for fabricating the second embodiment of the present invention and corresponds to FIG. 3e for the first embodiment. In this second embodiment, the tantalum film is oxidized throughout its thickness into tantalum oxide film 10 which forms the dielectric film of the capacitor element. Therefore the surface of lower electrode 13 is the surface of ruthenium film 8 which is in contact with tantalum oxide film 10. Thereafter, the DRAM of the second embodiment has the structure illustrated in FIG. 2 illustrating the first embodiment, with the exception of the tantalum film, which has been removed.

Figure 6:
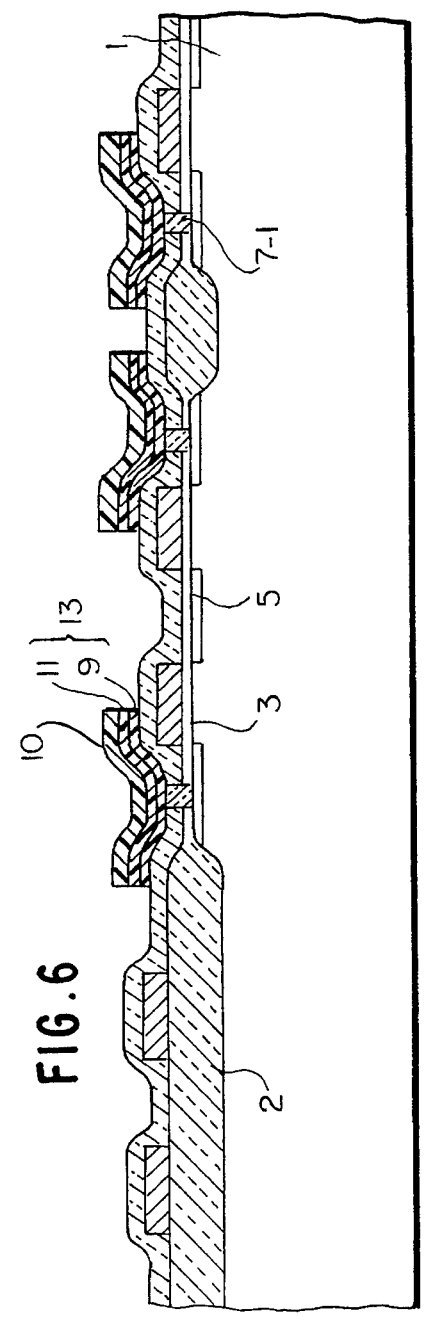
FIG. 6 is a sectional view illustrating a processing step for fabricating a third embodiment of the present invention.

FIG. 6 is a cross sectional view of a processing step for fabricating the third embodiment of the present invention and corresponds to FIG. 3e for the first embodiment. In the third embodiment, the tantalum film is oxidized throughout its thickness, and additionally the surface of ruthenium film 8 is oxidized to form ruthenium oxide film 11. Ruthenium oxide film 11 has a resistivity of 30 to 100 μΩ.cm, and forms the surface layer of lower electrode 13 of the capacitor, and therefore the capacitance value of the capacitor element is not reduced by formation of a ruthenium oxide film. In the third embodiment, the dielectric film of the capacitor element consists of tantalum oxide film 10, and lower electrode 13 of the capacitor consists of ruthenium oxide film 11 and the remaining ruthenium film 9. Thus dielectric film 10 is in contact with the surface of ruthenium oxide film 11 which is the surface of lower electrode 13. In other words, the ruthenium oxide film is used instead of tantalum film 9 in the DRAM of FIG. 2 illustrating the first embodiment.

FIGS. 7a to 7c illustrate the application of the processing steps of FIGS. 4a and 4b to the process of fabricating the third embodiment of FIG. 6. In the processing step of FIG. 7a, the layer of ruthenium film 8 and tantalum film 9 is patterned, and then sidewall spacers 6-2 are formed in the processing step of FIG. 7b. Thereafter tantalum oxide film 10 is formed as the dielectric film. An enlarged drawing of the state of the device after converting the overall thickness of tantalum film 9 to tantalum oxide film 10, and the entire sidewalls of ruthenium film 8 to ruthenium oxide film and the upper electrode 7-2 is formed is illustrated in FIG. 7c.

Figure 8:
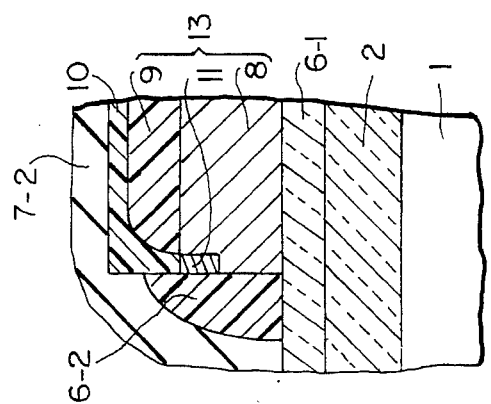
FIG. 8 is a sectional view illustrating a processing step of a fourth embodiment of the invention.

FIG. 8 is a cross sectional view showing to an enlarged scale fragmentarily the device of the fourth embodiment of the present invention. This embodiment is carried out in the same process as illustrated in FIGS. 4a to 4c. In this embodiment, dimensions of the parts and conditions of the thermal treatment are selected such that there have been conversion of the upper surface and sidewalls of tantalum film 9 to tantalum oxide film 10, and conversion of only the upper portions of the sidewalls of ruthenium film 8 to conductive ruthenium oxide film 11. Thus in the fourth embodiment, lower electrode 13 is constructed of the remaining tantalum film 9, ruthenium film 5 and ruthenium oxide film 11.

Figure 9A:
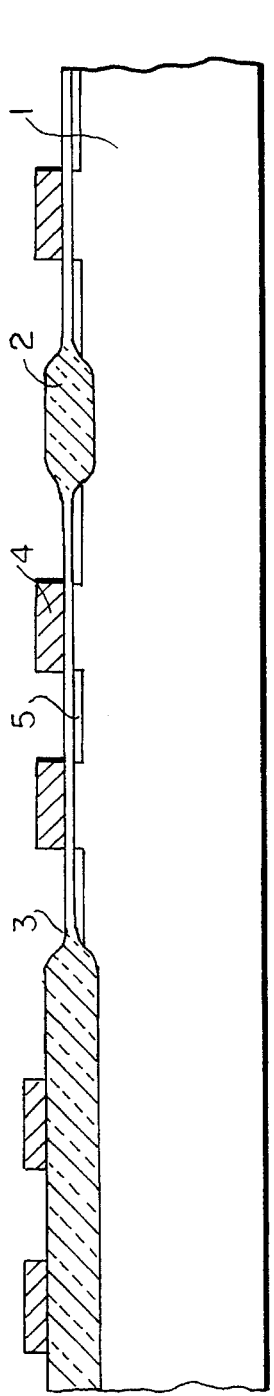
FIGS. 9a to 9h are sectional views illustrating in sequence an example of a process for fabricating a fifth embodiment of the present invention.
Figure 9B:
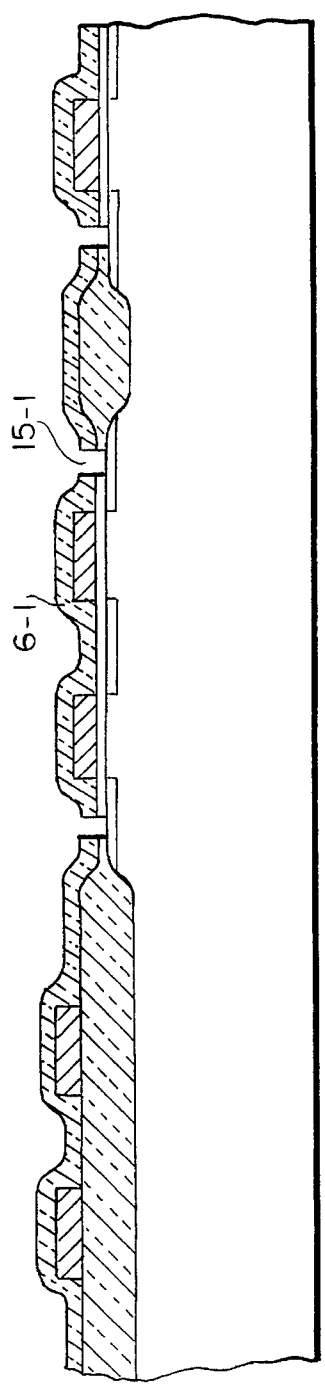
Figure 9C:
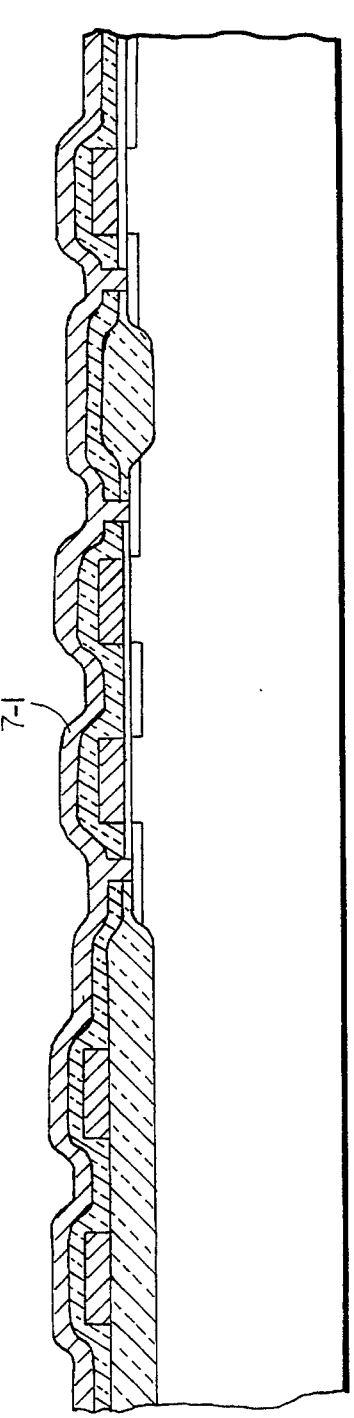
Figure 9D:
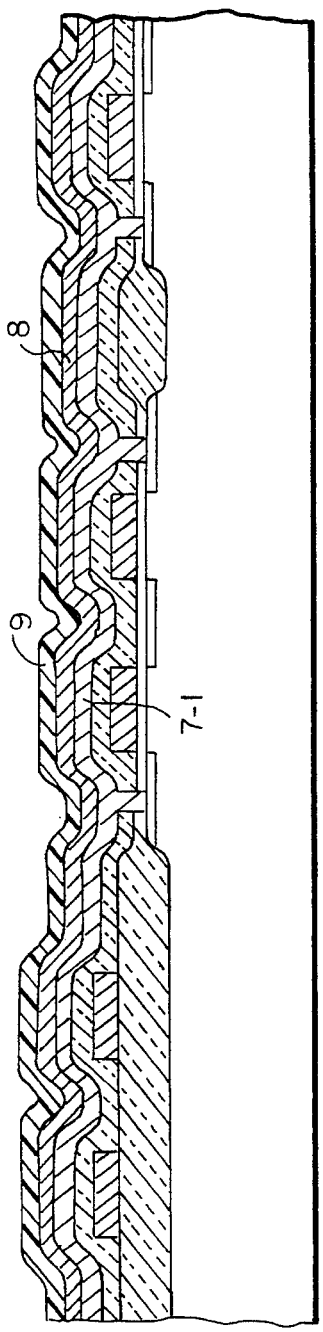

FIGS. 9a to 9h are cross sections of processing steps for fabricating the fifth embodiment. In FIGS. 9a to 9h, the corresponding parts or components to those in the drawings for the other embodiments are designated with the same reference characters, and hence re-description of them are omitted. The aspects of the fifth embodiment which are different from the other embodiments are that the first conductor layer 7-1 made of polysilicon film in FIG. 9c is not etched back but a double layer of ruthenium film 8 and tantalum film 9 is overlaid in the processing step of FIG. 9d.

Figure 9E:
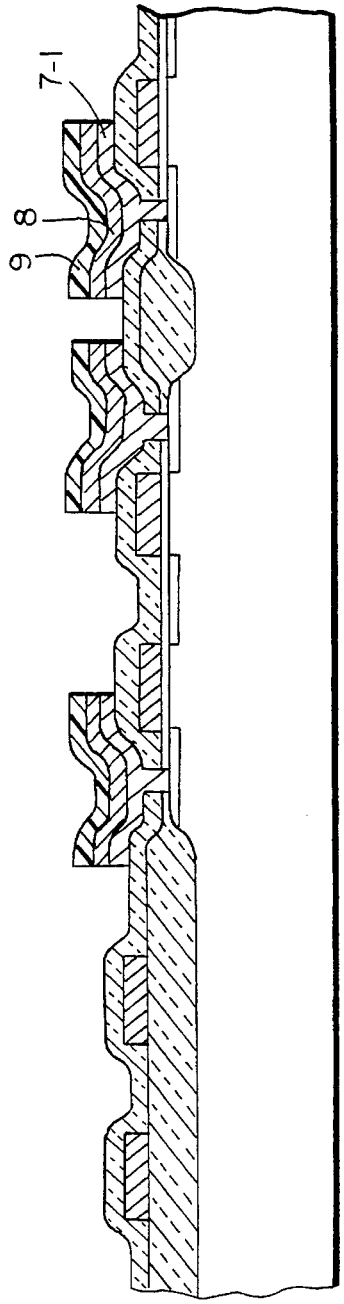
Figure 9F:
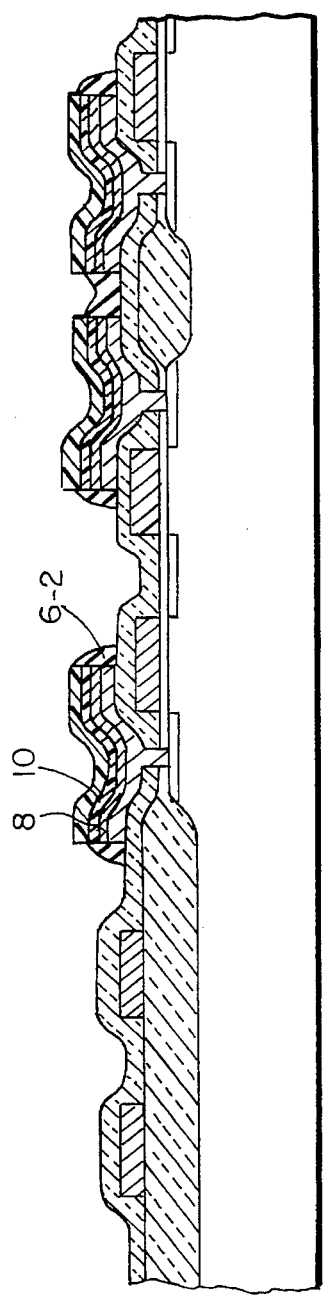
Figure 9G:
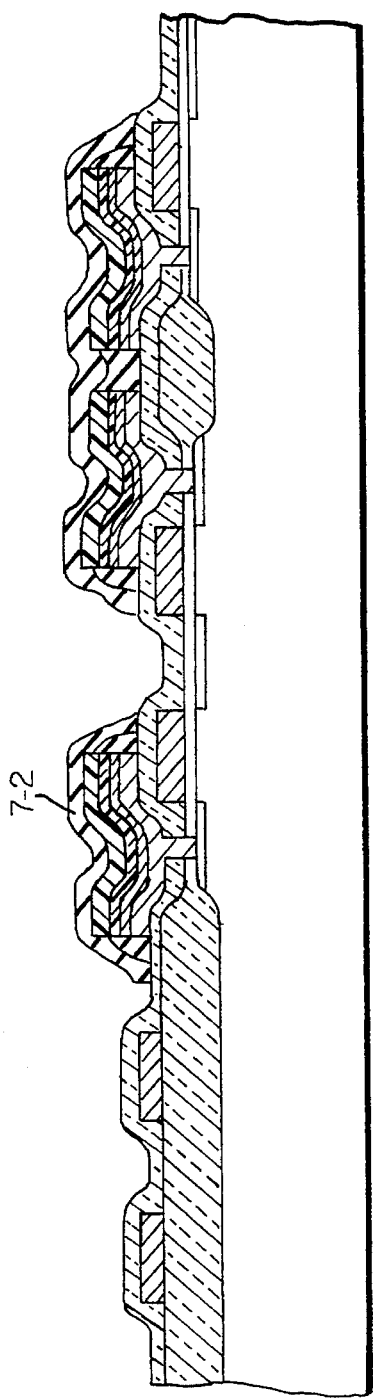
Figure 9H:
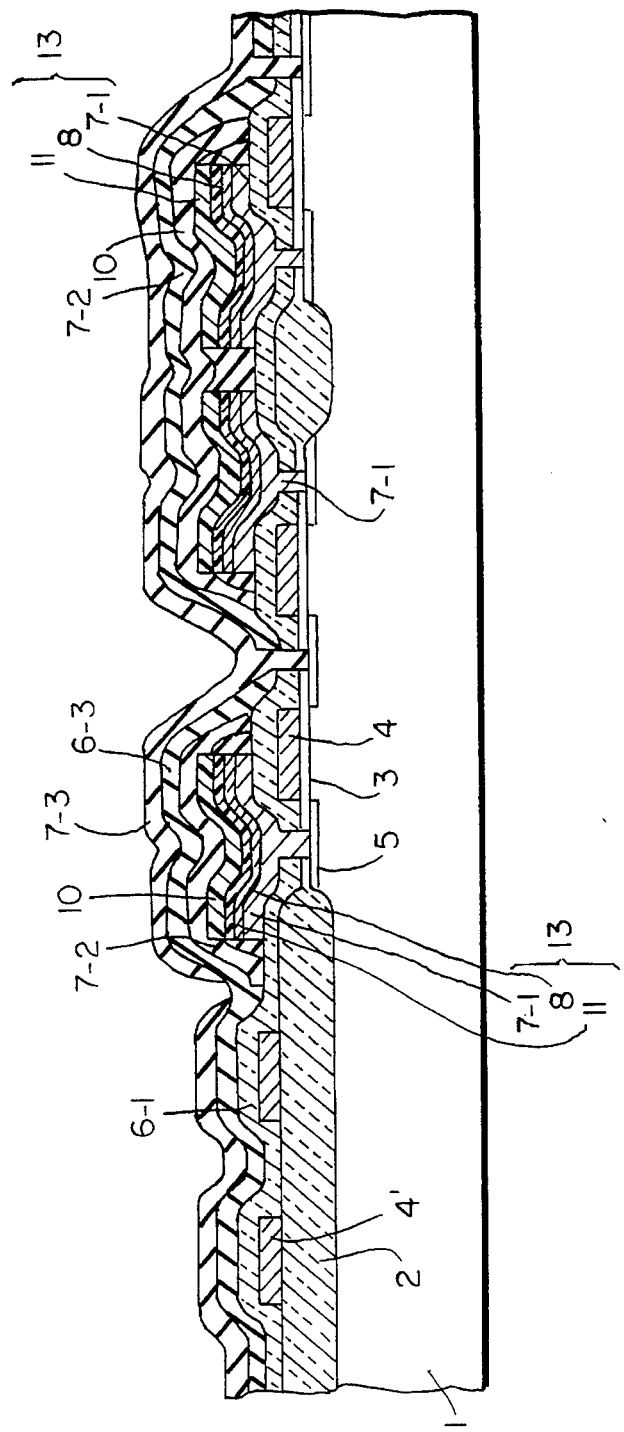
Figure 10A:
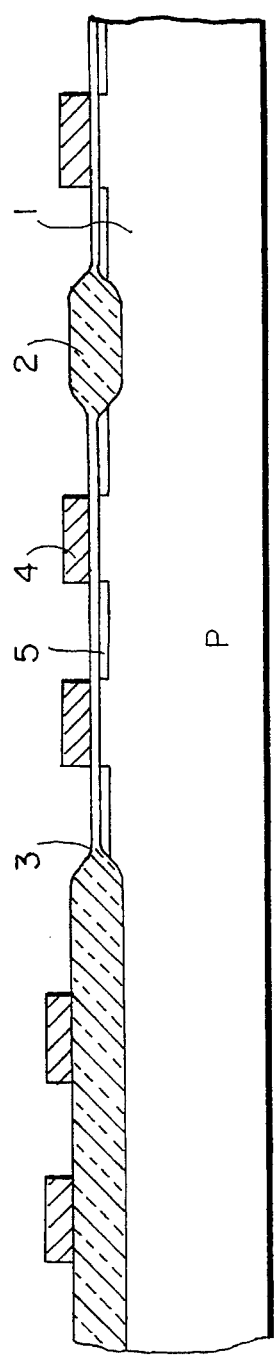
Figure 10B:
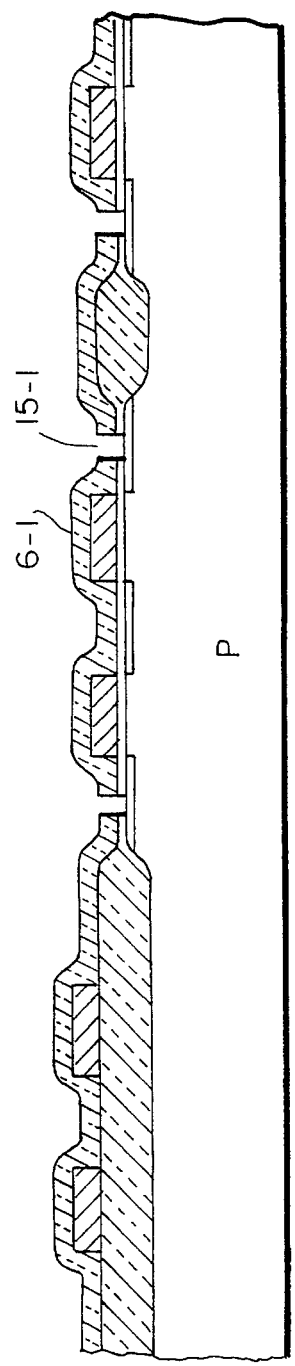
Figure 10C:
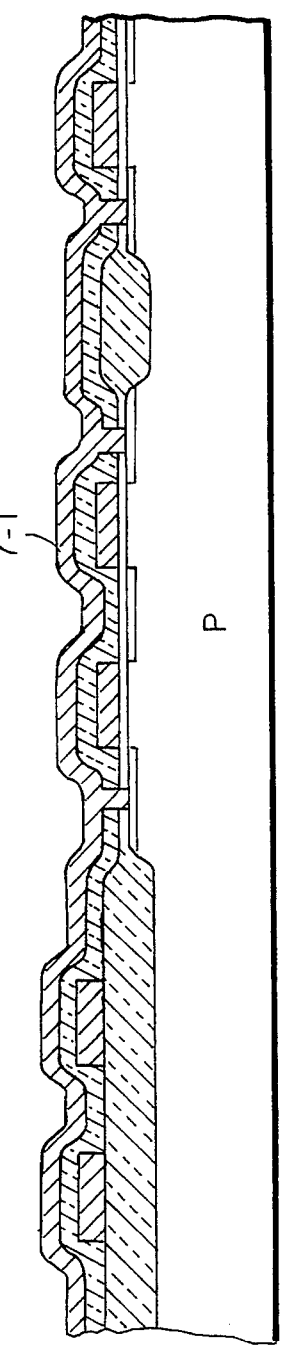

Accordingly, as illustrated in FIG. 9h, lower electrode 13 is constructed of the first conductor layer 7-1 of polysilicon film, ruthenium film 8 and a ruthenium oxide film 11. And, as illustrated in FIGS. 9e and 9f, tantalum oxide film 10 of the dielectric film is formed in the same way as illustrated in FIGS. 4a to 4c and FIGS. 7a to 7c by thermal treatment after forming sidewall spacers 6-2.

As described above, the present invention is provided with a high-melting-point-metal film, the oxide of which film is conductive, beneath the dielectric film, which can prevent the storage capacitance of the capacitor element from decreasing due to oxidation which may occur during formation of the dielectric film. Moreover, the sidewalls of the lower electrode and the dielectric film are covered with sidewall spacers of dielectric material having a dielectric constant less than that of the dielectric film. Therefore the parasitic capacitances associated with the electrodes are minimized.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor device comprising:

a semiconductor substrate;

an insulating film covering said semiconductor substrate;

first and second conductive layers formed on said insulating film apart from each other thereby forming respective sidewalls facing each other, each of said first and second conductive layers including a film made of metal whose oxide has an electrical conductivity;

a first dielectric film formed on said first conductive layer with a substantially same pattern as said first conductive layer;

a second dielectric film formed on said second conductive layer with a substantially same pattern as said second conductive layer, said first and second dielectric films thereby having top surfaces and respective sidewalls, the sidewalls facing each other, and each of said first and second dielectric films having a first dielectric constant;

a third dielectric film having a second dielectric constant that is smaller than said first dielectric constant and filling a space between said first and second conductive layers in contact with the sidewalls of said first and second conductive layers and further with the sidewalls of said first and second dielectric films, wherein said third dielectric film does not cover said top surfaces of said first and second dielectric films; and a third conductive layer formed continuously to cover said first, second and third dielectric films in contact respectively with said first, second and third dielectric films, wherein said first conductive layer, said first dielectric film and a part of said third conductive layer constitutes a first capacitor, and said second conductive layer, said second dielectric film and another part of said third conductive layer constitutes a second capacitor which has one electrode connected in common to one electrode of said first capacitor through said third conductive layer.

2. A semiconductor device as claimed in claim 1, wherein each of said first and second conductive layers is of a double-layered structure of said metal film and tantalum film, and each of said first and second dielectric films is formed on said tantalum film of an associated one of said first and second conductive films.

3. A semiconductor device as claimed in claim 2, wherein said oxide of said metal film is formed on the sidewall of said metal film, and constitutes a part of an associated one of said first and second conductive films together with said tantalum film.

4. A semiconductor device as claimed in claim 1, wherein each of said first and second conductive layers is of a double-layered structure of said metal film and the oxide of said metal film, and each of said first and second dielectric films of an associated one of said first and second conductive films is formed on the oxide of said metal film.

5. A semiconductor device as claimed in claim 1, wherein resistivity of said oxide of said metal film is less than $10^{-3}$ Ω.cm.

6. A semiconductor device as claimed in claim 1, wherein said metal film is a film of metal selected from the group consisting of Mo, Tc, Ru, W, Re, Os, Ir and Pt.

7. A semiconductor device comprising:

a semiconductor substrate;

first and second regions selectively formed in said semiconductor substrate apart from each other;

an insulating film covering said semiconductor substrate including said first and second regions therein;

first and second contact holes selectively formed in said insulating film to expose a part of said first region and a part of said second region;

a first conductive layer formed in contact with said part of said first region through said first contact hole and elongated over said insulating film;

a second conductive layer formed in contact with said part of said second region through said second contact hole and elongated over said insulating film in isolation by a space from said first conductive layer, thereby forming respective sidewalls, each of said first and second conductive layers including a metal layer and a conductive oxide layer of said metal layer formed on said metal layer;

a first dielectric film formed in contact with and with a substantially same pattern as said oxide layer of said first conductive layer;

a second dielectric film formed in contact with and with a substantially same pattern as said oxide film of said second conductive layer, each of said first and second dielectric films having a first dielectric constant and top surfaces;

a third dielectric film having a second dielectric constant that is smaller than said first dielectric constant and filling said space between said first and second conductive layers in contact with said respective sidewalls of said first and second conductive layers and said first and second dielectric films, wherein said third dielectric film does not cover the top surfaces of said first and second dielectric films; and a third conductive layer formed continuously on said first, second and third dielectric films in contact therewith and in isolation from said first and second conductive layers by said first, second and third dielectric films.

8. The device as claimed in claim 7, wherein said first and second conductive layers further have a polysilicon layer filling said first and second contact holes thereby being in contact with said metal layer and one of said first and second regions.

9. The device as claimed in claim 8, wherein said metal layer is made of a metal selected from a group consisting of Mo, Tc, Ru, W, Re, Os, Ir and Pt, and said first and second dielectric film is made of tantalum oxide.

* * * * *